(12) United States Patent
Morzano et al.

(10) Patent No.: US 6,392,453 B1
(45) Date of Patent: May 21, 2002

(54) DIFFERENTIAL INPUT BUFFER BIAS CIRCUIT

(75) Inventors: Christopher K. Morzano; Mark R. Thomann, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/884,081

(22) Filed: Jun. 20, 2001

(51) Int. Cl.⁷ ................................................ H03K 3/00
(52) U.S. Cl. ........................... 327/108; 327/52; 327/65; 327/89
(58) Field of Search .......................... 327/52–57, 65–67, 327/89, 563, 108–112; 330/252, 253

(56) References Cited

U.S. PATENT DOCUMENTS 6,281,714 B1 * 8/2001 Ang et al. .................... 327/57

* cited by examiner

Primary Examiner—Kenneth B. Wells
(74) Attorney, Agent, or Firm—Dickstein Shapiro Morin Oshinsky LLP (57) ABSTRACT

An integrated differential buffer circuit and its method of operation are described in which the buffer circuit has an internal bias line for controlling the supply of voltage to the buffer circuit. When the buffer circuit is first enabled, a start voltage is initially applied to the bias line and then removed to ensure proper operation of the buffer circuit when first enabled.

48 Claims, 5 Drawing Sheets

DIFFERENTIAL INPUT BUFFER BIAS CIRCUIT

The present invention relates generally to integrated circuits and in particular the present invention relates to integrated differential input buffer circuits.

DISCUSSION OF THE RELATED ART

A differential buffer circuit is typically provided to monitor the transitions of an input signal relative to a reference signal and produce an output signal indicating the detection of a transition in the input signal.

Figure 1:
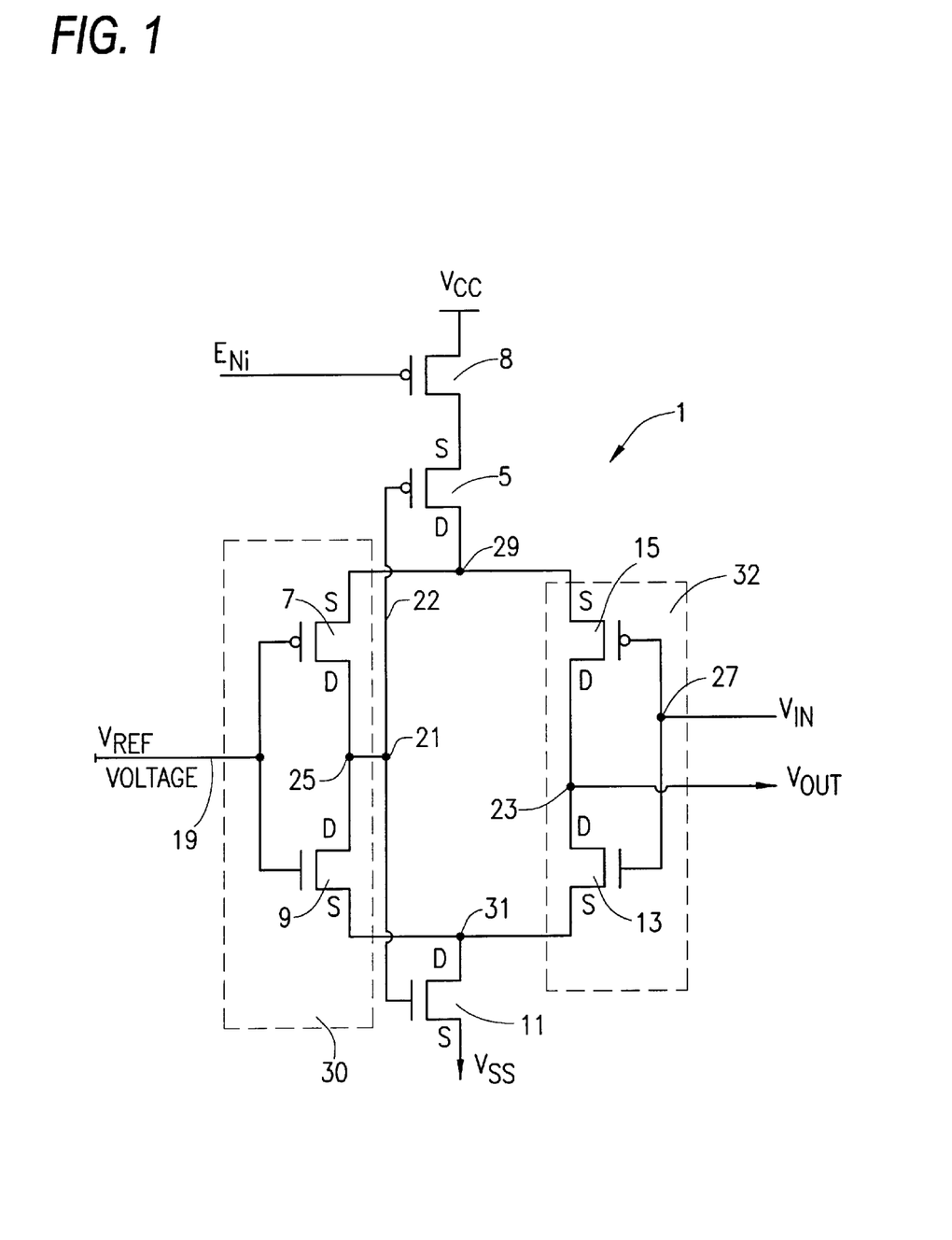
FIG. 1 is a known differential input buffer circuit.

Referring to the drawings, FIG. 1 shows a differential buffer circuit generally designated by the numeral 1 which includes complementary p-channel and n-channel transistors 7 and 9 form one inverter circuit branch 30 of the differential circuit, while complementary transistors 13 and 15 forming another inverter circuit branch 32 which is connected in parallel with branch 30 at connection nodes 29 and 31. The gates of complementary transistors 7 and 9 are connected in common to a reference voltage VREF. The gates of complementary transistors 15 and 13 are connected in common to an input voltage Vin at node 27. The drain of transistor 7 is connected to the drain of transistor 9 at node 25 which is connected to a node 21 connected to bias signal line 22. Thus, the output signal of inverter branch 30 is applied to node 21 as an input signal to the gates of complementary p-channel and n-channel transistors 5 and 11. The source of transistor 7 is connected to the drain of transistor 5 and the source of transistor 15 at node 29. The source of transistor 5 is connected to a first supply voltage Vcc through an enabling p-channel transistor 8 which receives an inverse enabling signal ENi of an enabling signal EN. The drains of transistors 15 and 13 are connected together to provide an output signal Vout at node 23. The source of transistor 13 is connected to the drain of n-channel transistor 11 and the source of transistor 9 at node 31. The source of transistor 11 is connected to a second supply voltage Vss which may be ground.

When circuit 1 is in power down mode and an enable signal EN (not shown) is in a low state, the inverse of EN, namely ENi, is in a high state, transistor 8 is off, and Vcc is not supplied to the differential buffer circuit 1. During this time the internal bias node 21 can be at ground voltage. Since the voltage on this node controls the bias power supplied to the buffer circuit 1 by controlling transistors 5 and 11, the circuit buffer 1 is slow to operate after being enabled if the first applied data signal at Vin is low. This is because a voltage cannot be quickly supplied to the output of the inverter circuit branch 32 formed by transistors 13 and 15. Accordingly, the buffer circuit 1 may not correctly operate at the beginning of an enabled operation.

Hence, what is needed is a differential buffer circuit which overcomes the above-noted shortcomings and produces proper operation of buffer circuit 1 when it is first enabled.

SUMMARY OF THE INVENTION

The present invention provides a differential buffer circuit which provides a sufficient operating voltage at bias node 21 when the buffer circuit is first enabled thereby ensuring proper differential buffer circuit operation at the time of enablement.

In one embodiment of the invention a transistor circuit responsive to an inverse enabling signal ENi is used to quickly bring a bias signal line to a proper operating voltage in response to the buffer circuit being enabled, and a delay circuit is used to produce a delayed version of the inverse enabling signal which is used to turn off the transistor circuit after a proper voltage is attained on the bias signal line.

In another embodiment of the invention, the delay circuit is omitted and the inverse of the enable signal ENi is passed directly to the bias signal line through a first transistor device to keep it at a predetermined initial voltage when the differential buffer circuit is disabled. When the inverse enable signal is exerted to turn on the buffer circuit, the first transistor device is tuned off. In the second embodiment, a second transistor device may also be used to prevent the bias signal line from drawing current when the buffer is disabled.

The above advantages and features of the invention will be more clearly understood from the following detailed description which is provided in connection with the accompanying drawings.

DETAILED DESCRIPTION OF THE INVENTION

The invention will be illustrated with respect to several embodiments. However, it should be understood that these embodiments are only exemplary of the invention and that other embodiments, modifications of the illustrated embodiments and other changes may be made without departing from the spirit or scope of the invention.

Figure 2:
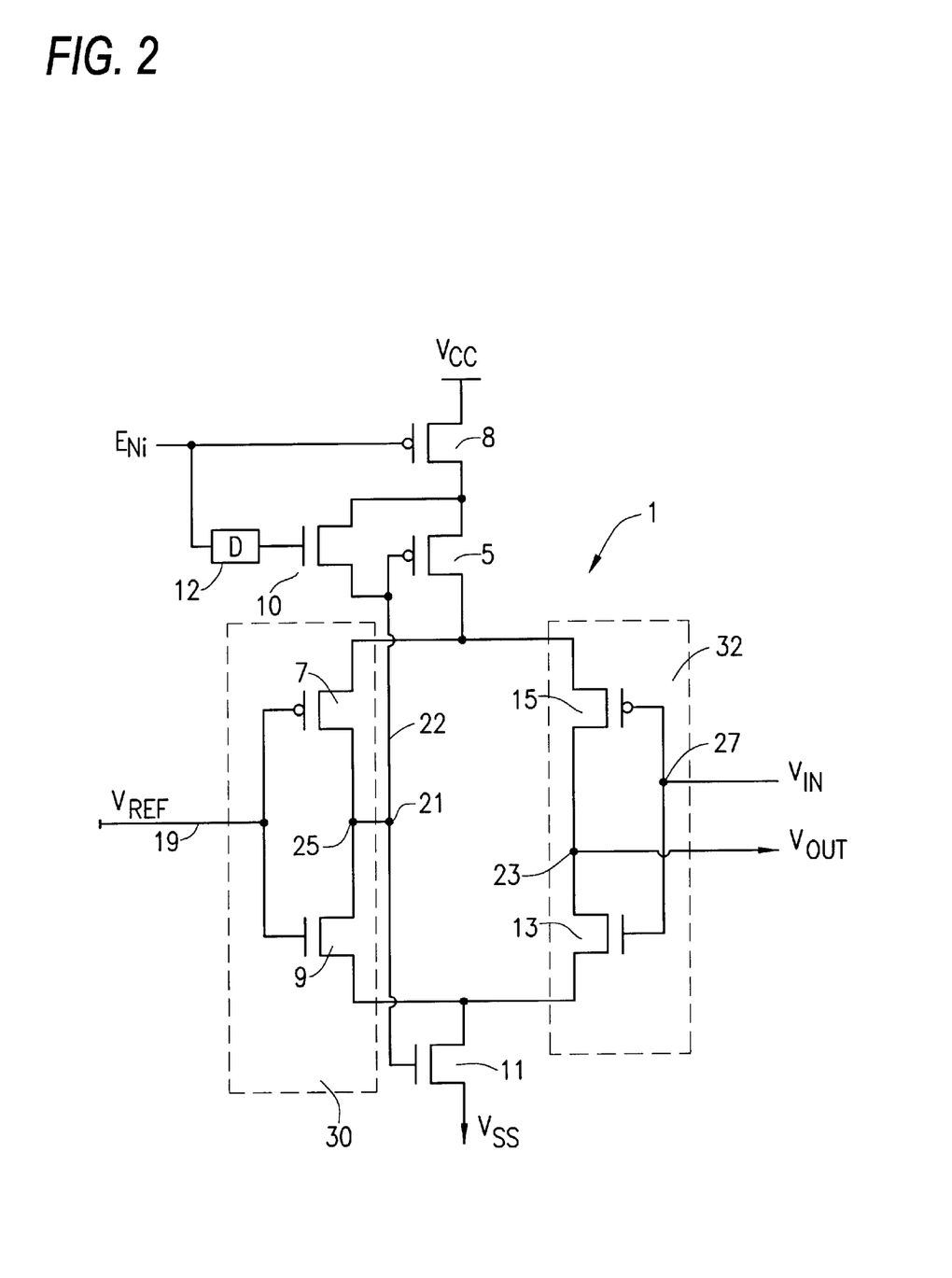
FIG. 2 is a schematic diagram of a differential buffer circuit in accordance with a first embodiment of the present invention.

A first embodiment of the invention is illustrated in FIG. 2. As shown, the FIG. 2 circuit is very similar to that of FIG. 1, and indeed like structures are given like reference numbers. In the FIG. 2 embodiment, an additional n-channel transistor 10 is provided having a drain which is connected at the interconnecting node between transistor 8 which enables the illustrated differential buffer circuit, and transistor 5 which supplies operative power, in response to the bias signal on the bias line 22 connected to node 21, to the branches 30 and 32 of the differential buffer circuit. The source of transistor 10 is connected to the bias reference line 22, and thus to nodes 21 and 25.

The gate of transistor 10 is connected to a delay circuit 12, which receives as an input the inverted enable signal ENi. Transistor 8 is enabled when the inverted enable signal ENi is low. As a consequence, when the signal ENi is high, transistor 8 is disabled, thereby preventing the supply of operative power from the power source, for example, from a supply potential Vcc to the differential buffer circuit 1. When ENi is high, the gate of transistor 10 will be biased towards an operative state. However, since no operative power is being supplied to transistor 10 because transistor 8 is disabled, there is no effect on the operation of the circuit of FIG. 2. However, when the inverted enable signal ENi goes low to enable operation of the differential buffer circuit 1, it turns on transistor 8 which applies voltage Vcc, to the drain of transistor 10, and from there to the bias signal line 22, so that the voltage 22 on the bias signal line and node 21 immediately increases to a voltage value which allows proper operation of the differential buffer circuit. Thus, even when a first pulse is applied to the input Vin, after the buffer circuit is enabled, a proper output Vout can be obtained from the differential buffer circuit.

After the transistor 8 is enabled by the low level of the inverted enable signal ENi, that low level signal is applied through delay 12 to the gate of transistor 10, turning transistor 10 off. Thus, the initial start voltage applied by transistor 10 to the bias signal line 22 is removed so that this initial start voltage is only applied when the differential buffer circuit is first enabled, after which the start voltage is removed, with the bias voltage on the bias line 22 then being supplied by the inverter branch 30 of the differential buffer circuit in response to the VREF input on signal line 19.

Figure 3:
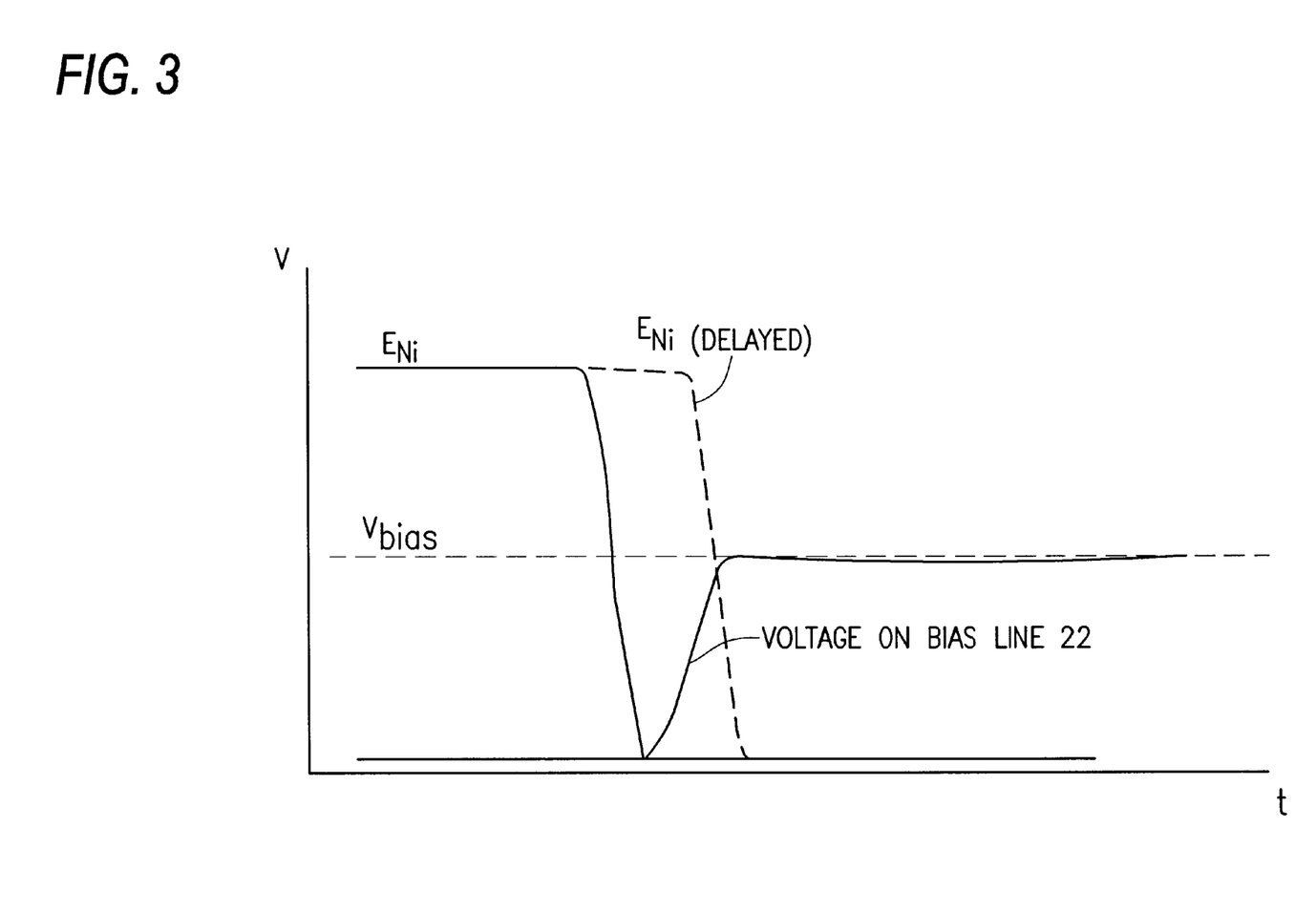
FIG. 3 illustrates the voltage of a bias node of the FIG. 3 circuit at start up.

FIG. 3 illustrates operation of the FIG. 2 circuit with respect to the voltage on bias line 22 in response to the inverter enabling signal ENi going to a tow state. When ENi goes low, transistor 10 starts immediately applying the voltage Vcc at the connection point between serially connected transistors 5 and 8 to the bias signal line 22, causing it to increase up to a suitable level for proper operation of the differential buffer circuit 1. Thereafter, the delayed version of ENi is produced which turns off transistor 10, allowing the bias voltage at node 21 to be supplied by the branch 30 of the differential buffer circuit. More specifically, the output node 25 provides the bias voltage at node 21 to bias signal line 22. Transistor 10 is shown as an n-channel transistor, but it is also possible to use a p-channel transistor and provide an inverter between the delay circuit 12 and the gate of a p-channel transistor.

Figure 4:
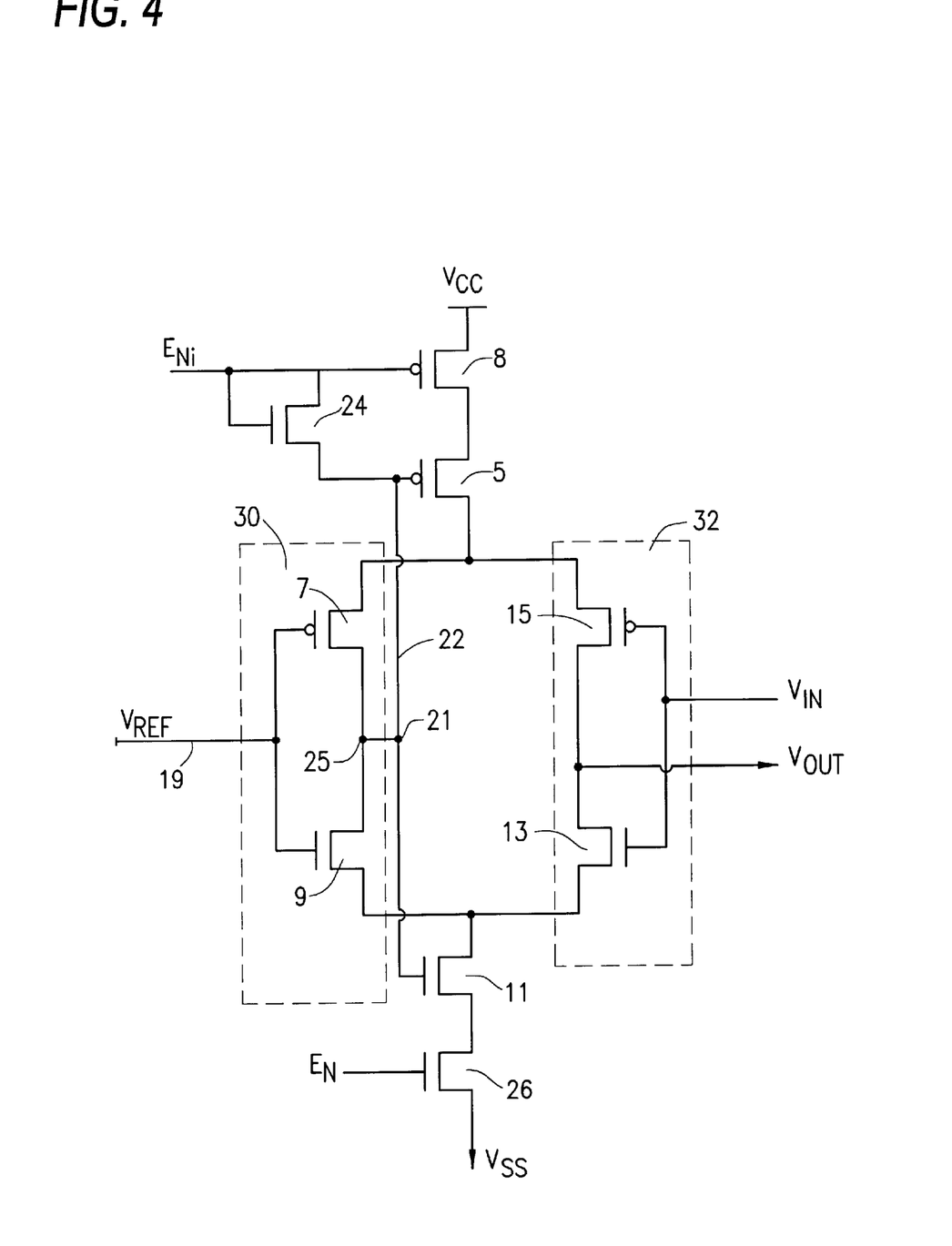
FIG. 4 is a schematic diagram of a differential buffer circuit in accordance with a second embodiment of the present invention.

A second embodiment of the invention is illustrated in FIG. 4. In this embodiment, an n-channel transistor 24 is connected as a diode between the inverted enable signal ENi and the bias signal line 22. In this arrangement, the high state of the signal ENi, which keeps transistor 8 off, also serves to supply voltage through diode 24 to the bias signal line 22, thus in effect precharging bias signal line 22 to a voltage which is the voltage of the signal ENi (presumably Vcc) minus the threshold voltage Vt of the transistor 24 connected as a diode. Thus, the bias signal line 22 is supplied with a predetermined voltage so that when the inverter enabling signal ENi goes low to enable transistor 8 to supply operative power from a source Vcc to the buffer circuit 1, the existing voltage on bias signal line 22 also ensures proper initial operation of the differential buffer circuit.

In the FIG. 4 arrangement, when the inverted enable signal ENi signal goes low to enable transistor 8, it also turns off diode 24 so voltage is no longer supplied to the bias signal line 22 from the inverted enable signal ENi, and the voltage of bias signal line 22 is then supplied by the inverter branch 30 of the differential buffer circuit 1 in the manner described above with reference to FIG. 2. Although transistor 24 is illustrated as an n-channel transistor, it also possible to use a p-channel transistor and an inverter between the inverted enable signal line ENi and the p-channel transistor.

An additional aspect of the invention illustrated in FIG. 4 is the provision of an additional n-channel transistor 26 which is supplied with an enable signal EN which is the inverse of the inverted enable signal ENi. When the inverted enable signal ENi goes low to turn on transistor 8, the enable signal EN goes high to turn on transistor 26. Thus, transistors 8 and 26 supply operative power through transistors 5 and 11 to the differential buffer circuit 1. The additional n-channel transistor 26 is provided to prevent a current draw path between the high signal on inverted enable signal line ENi when the buffer circuit is disabled through the transistor 24, bias signal line 22, and through transistor 11 to ground. Transistor 26, when the EN signal is low, keeps transistor 26 off, and thus prevents this current draw path from being established.

Both embodiments of the invention illustrated in FIG. 2 and FIG. 4 provide an operative voltage on the bias signal line 22 very quickly when the differential buffer circuit is first enabled, thereby ensuring proper operation of the differential buffer circuit 1, even upon receipt of the first operative logic input signal after enablement at the Vin input following enablement of the differential buffer circuit 1.

Figure 5:
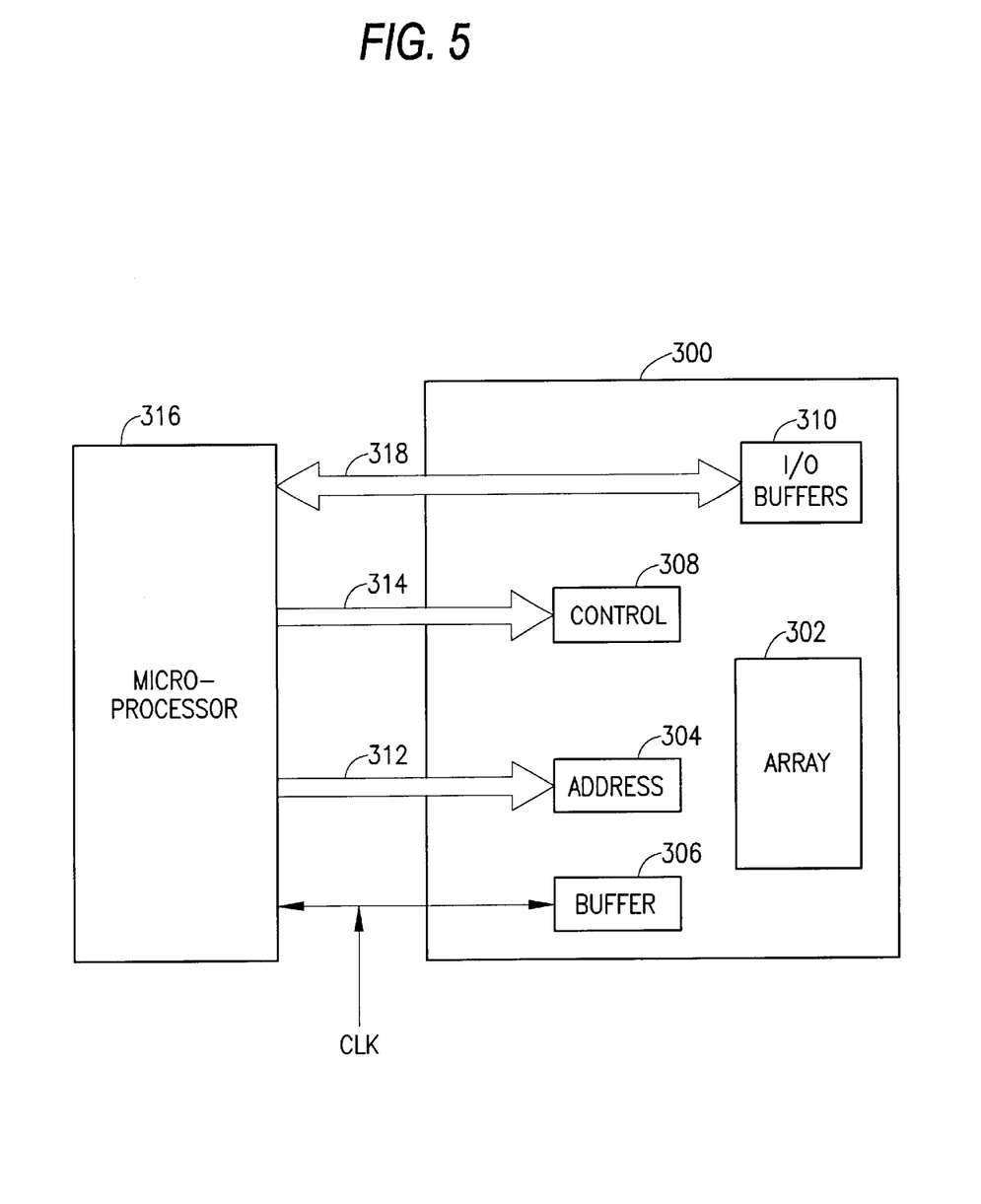
FIG. 5 is a block diagram of a synchronous memory device incorporating the present invention.

The differential buffer amplifier circuit of the invention may be provided in a memory device 300 shown in FIG. 5, which can be operatively coupled to a processor 316. As shown in FIG. 5, the memory device 300 may include a control circuit 308, address circuits 304, buffers 306, as well as a memory array 302. The differential buffer circuit of the invention may be used in the memory device 300, or in the microprocessor 316 itself, or in both devices.

While the invention has been described and illustrated with respect to specific exemplary embodiments, it should be understood that those embodiments are only exemplary and that many changes and modifications can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A differential buffer circuit comprising:
   a first inverter circuit branch for producing an inverted output signal in response to an applied input signal;
   a second inverter circuit branch for producing a bias voltage output signal on a bias signal line in response to an applied reference voltage;
   a voltage supply circuit for said first and second inverter circuit branches, said voltage supply circuit being responsive to a voltage on said bias signal line for providing supply voltage to said first and second inverter branches; and
   a control circuit enabled upon the enabling of said differential buffer circuit for causing said bias signal line to attain a predetermined operating voltage when said differential buffer circuit is first enabled, said control circuit being disabled during operation of said differential buffer circuit after said differential buffer circuit is first enabled.

2. A differential buffer circuit as in claim 1 wherein said control circuit comprises a transistor circuit which is enabled when said differential buffer circuit is disabled, said transistor circuit, when said differential buffer circuit is first enabled, supplying a voltage to said bias signal line which rises to said predetermined operating voltage.

3. A differential buffer circuit as in claim 1 wherein said transistor circuit is enabled for operation during a time when said differential buffer circuit is disabled, said transistor circuit being disabled a predetermined period of time after said differential buffer circuit is enabled.

4. A differential buffer circuit as in claim 3 wherein said transistor circuit comprises a control transistor for supplying an operating voltage, which is applied to said differential buffer circuit when said differential buffer circuit is enabled, to said bias signal line, and a delay circuit for supplying a delayed version of a signal which is used to enable said differential buffer circuit to a gate of said transistor.

5. A differential circuit as in claim 4 further comprising an enable transistor for supplying operating voltage to said differential buffer circuit in response to said signal which is used to enable said differential buffer circuit, said enable transistor and said control transistors being of complementary type.

6. A differential buffer circuit as in claim 5 wherein said enable transistor is a p-channel transistor, and said control transistor is an n-channel transistor, said signal used to enable said differential buffer circuit being a logic low signal.

7. A differential buffer circuit as in claim 1 wherein said voltage supply circuit comprises a first transistor for supplying a first operative voltage to said first and second inverter circuit branches and a second transistor for supplying a second operative voltage to said first and second inverter circuit branches, said first and second transistors being complementary transistors, the gates of said first and second transistors being coupled to said bias signal line.

8. A differential buffer circuit as in claim 4 wherein said voltage supply circuit comprises a first transistor for supplying a first operative voltage to said first and second inverter circuit branches and a second transistor for supplying a second operative voltage to said first and second inverter circuit branches, said first and second transistors being complementary transistors, the gates of said first and second transistors being coupled to said bias signal line.

9. A differential buffer circuit as in claim 8 wherein said control transistor has one of a source/drain terminal connected to one of a source/drain terminal of said first transistor and the other of a source/drain terminal connected to said bias signal line.

10. A differential buffer circuit as in claim 9 wherein said control transistor and said first transistor are complementary transistors.

11. A differential buffer circuit as in claim 1 wherein said control circuit comprises a transistor circuit which is enabled when said differential buffer circuit is disabled, said transistor circuit, all the time said differential buffer circuit is first enabled, supplying a predetermined voltage to said bias signal line.

12. A differential buffer circuit as in claim 11 wherein said predetermined voltage is derived from a signal which disables said buffer circuit.

13. A differential buffer circuit as in claim 12 wherein said transistor circuit comprises a transistor connected as a diode which is coupled to supply a signal which disables said buffer circuit to said bias signal line.

14. A differential buffer circuit as in claim 13 further comprising a first enable circuit which is responsive to a predetermined state of an inverted enable signal to supply operating voltage to said differential buffer circuit.

15. A differential buffer circuit as in claim 14 wherein said predetermined state is a logic low signal state.

16. A differential buffer circuit as in claim 15 wherein said enable circuit comprises a p-channel transistor and said inverted enable signal goes to a logic low state to enable operation of said p-channel transistor, to enable said differential buffer circuit, and to disable operation of said diode.

17. A differential buffer circuit as in claim 16 further comprising a second enable circuit which is responsive to a non-inverted enable signal for also enabling said differential buffer circuit, said second enable circuit including an n-channel transistor.

18. A differential buffer circuit as in claim 17 wherein said n-channel transistor is connected to said differential buffer circuit in a manner such that when said non-inverted enable signal has a logic state which disables said n-channel transistor and said differential buffer circuit is disabled, said disabled n-channel transistor prevents said bias signal line from drawing current.

19. A differential buffer circuit comprising:
a first CMOS inverter branch containing a first series connected pair of first and second complementary transistors having gates connected together;
a second CMOS inverter branch containing a second series connected pair of third and fourth complementary transistors having gates connected together, said first and second inverter branches being connected in parallel;
one of said first and second inverter branches having the gates of the transistors connected to receive an input signal with a series connection node of the transistors providing an output signal;
the other of said first and second inverter branches having the gates of the transistors connected to receive a reference voltage and a series connection node of the transistors providing a signal on a bias signal line;
a third series connected pair of fifth and sixth transistors provided between a first potential source and a first potential node where said parallel branches are connected;
a seventh transistor provided between a second potential source and a second potential node where said parallel branches are connected, the gates of one of said fifth and sixth transistors and said seventh transistor being connected to said bias signal line, the gate of the other of said fifth and sixth transistors being connected to receive an enable signal;
an eighth transistor connected between a series connection node of said fifth and sixth transistors and said bias signal line, the gate of said eighth transistor being connected to receive said enable signal through a delay circuit.

20. A differential buffer circuit as in claim 19 wherein said fifth and sixth transistors are p-channel transistors and said eighth transistor is an n-channel transistor.

21. A differential buffer circuit as in claim 20 wherein said seventh transistor is an n-channel transistor.

22. A differential buffer circuit comprising:
a first CMOS inverter branch containing a first series connected pair of first and second complementary transistors having gates connected together;
a second CMOS inverter branch containing a second series connected pair of third and fourth complementary transistors having gates connected together, said first and second inverter branches being connected in parallel;
one of said first and second inverter branches having the gates of the transistors connected to receive an input signal with a series connection node of the transistors providing an output signal;
the other of said first and second inverter branches having the gates of the transistors connected to receive a reference voltage and a series connection node of the transistors providing a signal on a bias signal line;
a third series connected pair of fifth and sixth transistors provided between a first potential source and a first potential node where said parallel branches are connected;
a seventh transistor provided between a second potential source and a second potential node where said parallel branches are connected, the gates of one of said fifth and sixth transistors and said seventh transistor being connected to said bias signal line, the gate of the other of said fifth and sixth transistors being connected to receive an enable signal; and a diode coupled at one end to receive said enable signal and at another end to said bias signal line.

23. A differential buffer circuit as in claim 22 wherein said diode is formed of an eighth transistor having a gate connected to one of a source and drain terminal.

24. A differential buffer circuit as in claim 22 further comprising:

a ninth transistor serially connected to said seventh transistor to couple said seventh transistor to said second potential source, the gate of said ninth transistor receiving another enable signal.

25. A differential buffer circuit as in claim 24 wherein said fifth and sixth transistors are p-channel transistors, and said seventh, eighth and ninth transistors are n-channel transistors.

26. A method of operating a differential buffer circuit comprising:

using a first branch of said differential buffer circuit to receive an applied signal and provide an output signal therefrom;

using a second branch of said differential buffer circuit to receive a reference voltage and provide a bias signal on a bias signal line;

using a bias signal on said bias line to control the operative power supplied to said first and second branches of said differential buffer circuit; and providing a starting voltage to said bias line during a period when said differential buffer circuit is first enabled and then removing said starting voltage from said bias signal line while said differential buffer circuit remains enabled.

27. A method as in claim 26 further comprising increasing said start voltage from a first value toward a second value on said bias signal line in response to the enabling of said differential buffer circuit.

28. A method as in claim 27 further comprising removing said start voltage a predetermined period of time after said differential buffer circuit is enabled.

29. A method as in claim 26 further comprising maintaining said start voltage at a predetermined value when said differential buffer circuit is disabled.

30. A method as in claim 29 further comprising removing said start voltage in response to the enablement of said differential buffer circuit.

31. A processor system comprising:

a processor; and at least one integrated circuit coupled to said processor, at least one of said processor and integrated circuit including a differential buffer circuit which comprises:

a first inverter circuit branch for producing an inverted output signal in response to an applied input signal;

a second inverter circuit branch for producing a bias voltage output signal on a bias signal line in response to an applied reference voltage;

a voltage supply circuit for said first and second inverter circuit branches, said voltage supply circuit being responsive to a voltage on said bias signal line for providing supply voltage to said first and second inverter branches; and a control circuit enabled upon the enabling of said differential buffer circuit for causing said bias signal line to attain a predetermined operating voltage when said differential buffer circuit is first enabled, said control circuit being disabled during operation of said differential buffer circuit after said differential buffer circuit is first enabled.

32. A system as in claim 31 wherein said control circuit comprises a transistor circuit which is enabled when said differential buffer circuit is disabled, said transistor circuit, when said differential buffer circuit is first enabled, supplying a voltage to said bias signal line which rises to said predetermined operating voltage.

33. A system as in claim 31 wherein said transistor circuit is enabled for operation during a time when said differential buffer circuit is disabled, said transistor circuit being disabled a predetermined period of time after said differential buffer circuit is enabled.

34. A system as in claim 33 wherein said transistor circuit comprises a control transistor for supplying an operating voltage, which is applied to said differential buffer circuit when said differential buffer circuit is enabled, to said bias signal line, and a delay circuit for supplying a delayed version of a signal which is used to enable said differential buffer circuit to a gate of said transistor.

35. A system as in claim 34 further comprising an enable transistor for supplying operating voltage to said differential buffer circuit in response to said signal which is used to enable said differential buffer circuit, said enable transistor and said control transistors being of complementary type.

36. A system as in claim 35 wherein said enable transistor is a p-channel transistor, and said control transistor is an n-channel transistor, said signal used to enable said differential buffer circuit being a logic low signal.

37. A system as in claim 31 wherein said voltage supply circuit comprises a first transistor for supplying a first operative voltage to said first and second inverter circuit branches and a second transistor for supplying a second operative voltage to said first and second inverter circuit branches, said first and second transistors being complementary transistors, the gates of said first and second transistors being coupled to said bias signal line.

38. A system as in claim 34 wherein said voltage supply circuit comprises a first transistor for supplying a first operative voltage to said first and second inverter circuit branches and a second transistor for supplying a second operative voltage to said first and second inverter circuit branches, said first and second transistors being complementary transistors, the gates of said first and second transistors being coupled to said bias signal line.

39. A system as in claim 38 wherein said control transistor has one of a source/drain terminal connected to one of a source/drain terminal of said first transistor and the other of a source/drain terminal connected to said bias signal line.

40. A system as in claim 39 wherein said control transistor and said first transistor are complementary transistors.

41. A system as in claim 31 wherein said control circuit comprises a transistor circuit which is enabled when said differential buffer circuit is disabled, said transistor circuit, all the time said differential buffer circuit is first enabled, supplying a predetermined voltage to said bias signal line.

42. A system as in claim 41 wherein said predetermined voltage is derived from a signal which disables said buffer circuit.

43. A system as in claim 42 wherein said transistor circuit comprises a transistor connected as a diode which is coupled to supply a signal which disables said buffer circuit to said bias signal line.

44. A system as in claim 43 further comprising a first enable circuit which is responsive to a predetermined state of an inverted enable signal to supply operating voltage to said differential buffer circuit.

45. A system as in claim 44 wherein said predetermined state is a logic low signal state.

46. A system as in claim 45 wherein said enable circuit comprises a p-channel transistor and said inverted enable signal goes to a logic low state to enable operation of said p-channel transistor, to enable said differential buffer circuit, and to disable operation of said diode.

47. A system as in claim 46 further comprising a second enable circuit which is responsive to a non-inverted enable signal for also enabling said differential buffer circuit, said second enable circuit including an n-channel transistor.

48. A system as in claim 47 wherein said n-channel transistor is connected to said differential buffer circuit in a manner such that when said non-inverted enable signal has a logic state which disables said n-channel transistor and said differential buffer circuit is disabled, said disabled n-channel transistor prevents said bias signal line from drawing current.

* * * * *